TRANSISTOR AMPLIFIER PROTECTIVE CIRCUITS

Filed Feb. 7, 1966

INVENTOR
DAVID HAFLER

BY Hurvitz & Rose

ATTORNEYS

April 29, 1969 D. HAFLER 3,441,864

TRANSISTOR AMPLIFIER PROTECTIVE CIRCUITS

Filed Feb. 7, 1966 Sheet 2 of 2

INVENTOR
DAVID HAFLER

BY Hurvitz & Rose

ATTORNEYS

United States Patent Office 3,441,864

Patented Apr. 29, 1969

3,441,864
TRANSISTOR AMPLIFIER PROTECTIVE CIRCUITS

David Hafler, Merion Station, Pa., assignor, by mesne assignments, to TLD, Inc., Philadelphia, Pa., a corporation of Pennsylvania Filed Feb. 7, 1966, Ser. No. 525,401
Int. Cl. H03f 3/18, 21/00, 3/68
U.S. Cl. 330—11 11 Claims

ABSTRACT OF THE DISCLOSURE

A protective network for a push-pull class B unity gain transistor amplifier employing series connected transistors, in which a semi-conductor switch is connected between the input terminal and the load to pass the input signal into the load when the input signal amplitude instantaneously exceeds the voltage across the load by a predetermined amount.

The present invention relates generally to protective circuits for transistor amplifiers and more particularly to improved networks effective to limit current levels in transistor amplifiers by short circuiting amplifier input to amplifier output under those conditions which would otherwise result in destructive currents in the transistors.

The basis for many high quality transistor amplifiers is a power stage configuration in which the output is taken from the junction of a pair of series-connected or complementary-symmetry output transistors driven by balanced signals deriving from respective transistors of a complementary-symmetry phase inverter. The input signal from the preceding stages of the circuit in which this basic power stage configuration is used is applied via a biasing arrangement to the input electrodes of the phase inverter stage transistors. In another basic type of power stage configuration the output is taken directly from the junction between the emitters of the complementary symmetry stage transistors so that the previously mentioned output stage is eliminated.

Both of these transistor amplifier configurations have the common feature that they provide no voltage gain, but merely effect a power transfer in which a high impedance input signal is converted into a low impedance output signal of approximately the same amplitude. However, both configurations are also limited in that they are particularly susceptible to excessive transistor currents, with a resulting likelihood of failure of the transistors, in the event of overdrive. The overdrive may be the result of input signals of excessive amplitude or may be the result of excessive loading of the output, or a combination of both.

In my copending U.S. patent application Serial No. 495,570, entitled "Transistor Amplifier Protective Circuit," I disclose a network which is to be used in conjunction with power stage configurations of the type mentioned above and which eliminates any inherent maintenance of the input-output relationship in the amplifier, under conditions which would otherwise result in destructive transistor currents, by opening a common path between input and output. In accordance with the present invention, damage to transistors in the amplifier is prevented under conditions of overdrive and/or excessive loading by using the low impedance output of the amplifier to short circuit the high impedance amplifier input when such conditions obtain. Briefly, this objective is achieved by use of one or more switching elements arranged to connect amplifier output and input in such a manner that the element or elements are switched from a non-conductive to a conductive state when transistor current reaches a predetermined level below that level which would result in self-destruction. In another form of the invention, the amplifier is cut off until the excessive driving signal or excessive loading is removed.

In one embodiment of the invention a pair of diodes are connected between the input electrodes of the complementary-symmetry transistors, and the junction between the diodes connected to the output side of a resistor from which the output of the amplifier is taken. Under normal input signal conditions the diodes remain biased to a non-conductive state despite the difference in potential between amplifier output and input caused by the voltage drop across the resistor. However, when peaks of the input signal are excessive or when the output of the amplifier is overloaded as may occur in the case of a short circuit, the drop across the resistor produces a forward bias on one of the two diodes resulting in a short circuit between the amplifier input and output which limits the input signal and thus prevents destructive transistor currents.

In another embodiment of the invention a further pair of diodes are connected to the junction from which the input signal is derived and a capacitor connected across this further pair of diodes as well as across the input electrodes of the complementary-symmetry transistors. The further diodes serve as biasing elements, but more importantly, are effective to rectify the input signal at such times when either of the first-mentioned pair of diodes becomes conductive. The rectified voltage is stored by the capacitor and thereby serves to maintain the forward bias diode in the conductive state as long as the excessive input signal condition or the overloaded output condition is present. The result of this operation is the cutting off of the amplifier until the undesirable condition is corrected. Either embodiment may be used with or without the output resistor and/or with only one diode in each case where a pair of diodes is mentioned above in those circumstances where economic considerations are paramount.

Accordingly, it is a primary object of the present invention to provide a new and improved transistor amplifier protective circuit.

It is another object of the present invention to provide a novel transistor amplifier protective circuit which is effective to provide a short circuit between the amplifier output and input terminals under conditions in which the transistor currents exceed a predetermined level.

Another object of the invention is to provide a protective circuit for transistor amplifiers wherein a switching element is employed to provide a by-pass path for the transistors between the input and output of the amplifier.

Still another object of the present invention is to provide a protective circuit for transistor ampllfiers wherein the amplifier is cut off during periods in which the amplifier is subjected to excessive input signal or excessive output loading.

It is still another object of the present invention to provide improved protective circuits for transistor amplifiers whereby amplifier operation ceases during periods when the amplifier output signal exceeds a predetermined level.

The above and still further objects, features and attendant advantages of the present invention will become apparent from a consideration of the following detailed description of certain embodiments thereof, especially when taken in conjunction with the accompanying drawings, in which.

Figure 1:
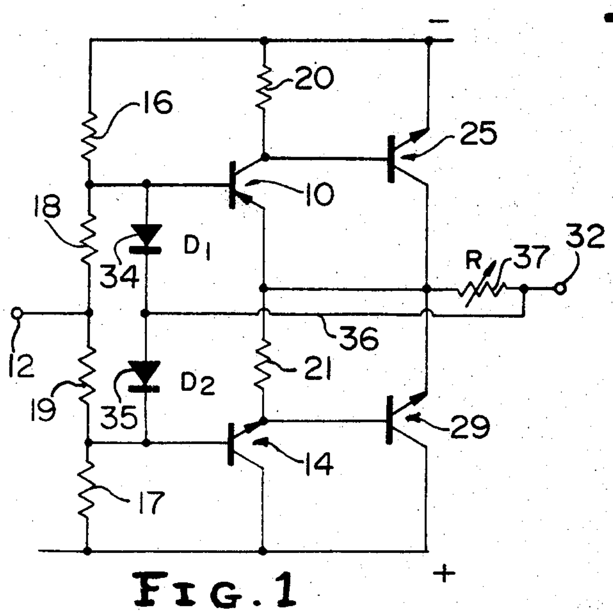
FIGURE 1 is a circuit diagram of one embodiment of the invention utilized in an amplifier having a complementary-symmetry driver stage feeding a series connected output stage.

Referring generally to the drawings, wherein like reference numerals are used to designate like components, and more particularly to FIGURE 1, a transistor amplifier to which the inventive concepts are particularly applicable and which is the basis for a wide variety of present-day transistor amplifier applications comprises a driver stage having a pair of complementary-symmetry transistors 10 and 14 arranged to provide balanced oppositely-phased output signals to an output stage including series-connected transistors 25 and 29. Input signal to the amplifier is applied at terminal 12, and in a conventional application the amplifier might be utilized to produce an audio output at the terminal 32 normally coupled to an electro-acoustic transducer such as a loudspeaker.

Resistors 16–19, inclusive, are used for biasing purposes, and the overall amplifier is powered by a voltage supply connected to the terminals designated (+) and (−). The amplifier thus far described is wholly conventional and no claims are made toward its configuration per se. The basic amplifier provides zero voltage gain so that the output signal taken from terminal 32 is approximately the same amplitude as the input signal at terminal 12, but the amplifier is useful to provide a power transfer in which a high impedance is presented to the input signal and a low impedance to the load. In the event of overdrive or of reduction in load impedance, for example by a short circuit of the output terminals of the amplifier in the latter case, the current through the transistors will exceed the specified maximum and will, if allowed, to continue, result in transistor failure.

In order to prevent destructive transistor currents, I provide a protective network including a pair of semiconductor junction diodes 34 and 35 connected in series between the input electrodes, in this case the base electrodes, of complementary-symmetry transistors 10 and 14, a resistor 37 connected between the junction of the series connected output stage transistors 25 and 29 and the output terminal 32, and a conductive path 36 between the junction of the two diodes 34 and 35 and output terminal 32. In the absence of this protective network the DC potential at input and output is at the midpoint of the total supply potential and the output voltage follows input voltage over the normal signal range. With the protective network connected as shown, diodes 34 and 35 are inherently biased to a non-conductive state, by virtue of the circuit configuration, over the normal range of input signal. With a load connected to the output terminal 32, however, a voltage drop exists across resistor 37 (and thus a drop in the output voltage of the amplifier) with a magnitude depending upon the amplitude of the input signal, the impedance of the load, and the resistance value of the resistor. A potential difference therefore exists between the input and the output of the amplifier. When the voltage drop across resistor 37 is such as to create a forward bias on either of the two diodes 34 and 35, that is a voltage difference between input and output which overcomes the normal reverse bias on the two diodes, or on either one of them, the forward biased diode is switched to the conductive state, thereby shorting input and output of the amplifier.

The value of resistor 37 may be selected or adjusted so that the above condition will obtain at a preselected transistor current level irrespective of whether the excessive current is a result of transistor overdrive or of a reduction in the load impedance. In the latter case, for example, excessive transistor currents will occur at peaks of the input signal swing and the resistance value of the resistor 37 may be successively reduced to cause the input-to-output short circuit to occur with smaller input signals. The resistor may thus be adjusted to set a maximum output signal level for a given load. It will, of course, be apparent that resistor 37 may be either variable, as shown, or fixed, with the resistance value preselected to produce input-to-output amplifier shorting according to a predetermined maximum value of transistor current.

It will further be recognized that some protection against excessive transistor current is effected even in the event that the output signal is taken directly from the junction between the series connected output stage transistors, i.e., in the event that resistor 37 is not used. In such a case, a discrepancy will exist between input and output potentials at any point at which the output signal exhibits distortion as a result of excessive input signal or reduced load impedance exceeding the capability of the transistors and the power supply. For example, if the amplifier is more heavily loaded than its design will permit, clipping will begin to occur at peaks of the signal swing. The potential difference between amplifier output and input will thus render the diodes conductive, imposing the desired limit on the amount of overload.

Figure 5:
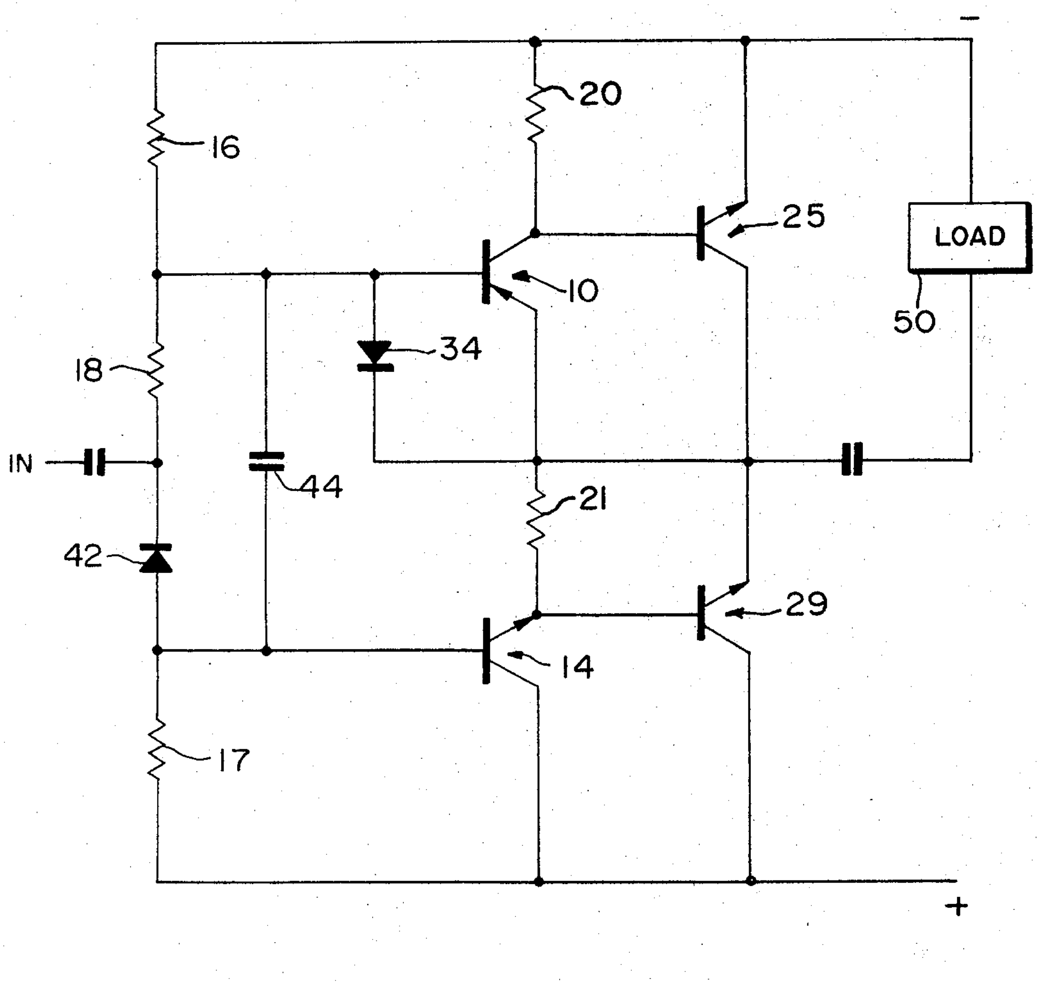
FIGURE 5 is a circuit diagram of an embodiment of FIGURE 3 in which a reduced number of parts is used for economical purposes.

In many amplifiers used in practice an overload will cause the output voltage to shift in a consistent direction, i.e., the shift will occur in one direction only, depending upon the supply terminal to which the load is taken. In such cases a single diode may be used in place of the two diode configuration previously described by connecting the single diode to the input electrode of the transistor at which the output potential shift will manifest itself as a forward bias on the diode when the predetermined transistor current level is reached. Such an arrangement is shown in FIGURE 5, to which further reference will be made presently.

Figure 2:
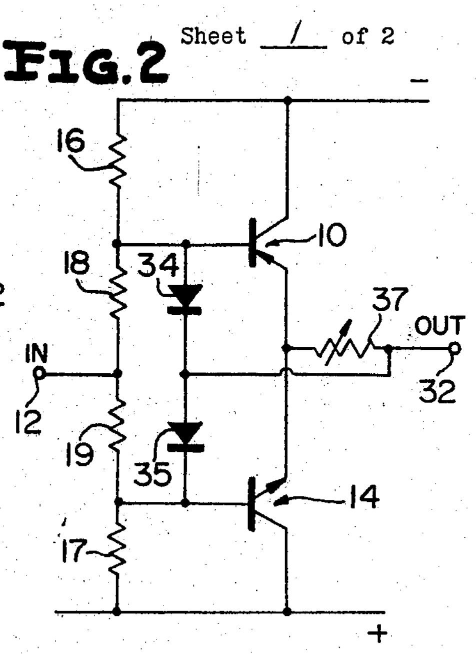
FIGURE 2 is a circuit diagram of the embodiment of FIGURE 1 utlized in a transistor amplifier having only a complementary-symmetry stage.

In the embodiment of FIGURE 2 only a single stage (the complementary-symmetry transistor stage) is used with the output taken directly from the junction between the transistors 10 and 14. Here again the basic amplifier configuration is conventional and like components are designated by reference characters corresponding to those used in FIGURE 1. The protective network comprising diodes 34 and 35, resistor 37, and conductive path 34 is connected within the amplifier configuration in a manner similar to that described above. Here again, the specific variations in components and construction mentioned above, as well as those modifications which will be apparent to persons of ordinary skill in the art, are applicable where conditions will permit. Further description of structure and operation is believed unnecessary in view of the analogy to FIGURE 1.

Figure 3:
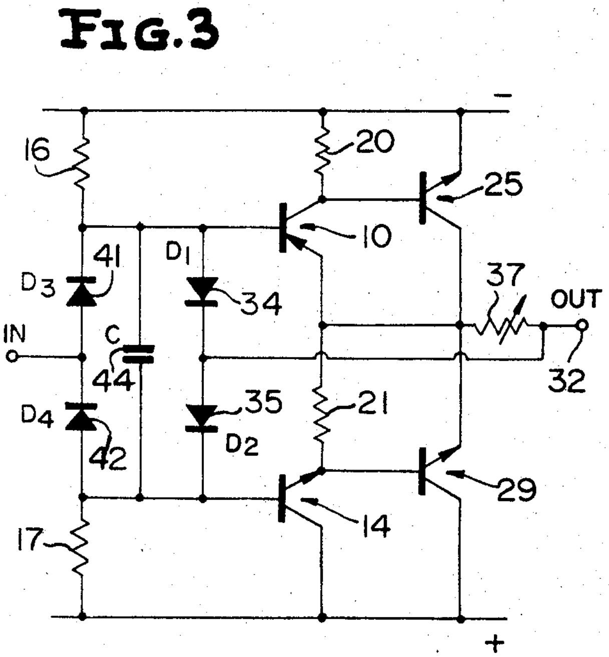
FIGURE 3 is a circuit diagram of another embodiment of the invention utilized in a transistor amplifier of the type shown in FIGURE 1.

Referring now to the embodiment of FIGURE 3 the basic amplifier configuration there shown is identical to that shown in FIGURE 1, the protective networks differing only in the replacement of biasing resistors 18 and 19 by series-connected diodes 41 and 42 and the addition of a capacitor 44 across the input electrodes of complementary-symmetry transistors 10 and 14. Diodes 41 and 42 provide the biasing function previously accomplished by resistors 18 and 19, and in addition, serve to rectify the input signal at such times that either or both of diodes 34 and 35 are forward biased to a conductive state under conditions previously described. The signal rectification results in the storage of a voltage by capacitor 44 and this voltage will be held as long as the undesirable condition resulting in the initial conduction of diode 34 or 35 exists. In other words, the stored voltage maintains the forward bias. In this embodiment, therefore, the protective network is effective to hold amplifier input shorted to amplifier output until the undesirable condition is corrected and the amplifier circuit reverts to its normal operation, instead of merely limiting signal peaks. The operation of this embodiment may be characterized as a cutting off or turning off of the amplifier until normal operation is restored.

Resistor 37 is effective in this embodiment to produce amplifier cutoff at a predetermined output level, thus protecting the loudspeaker or other load connected to the output of the amplifier. Alternatively, use of resistor 37 may be dispensed with in which case operation depends on the value at which the output signal clipping occurs. In the latter case the junction between diodes 34 and 35 is connected directly to the emitter of transistor 10.

Figure 4:
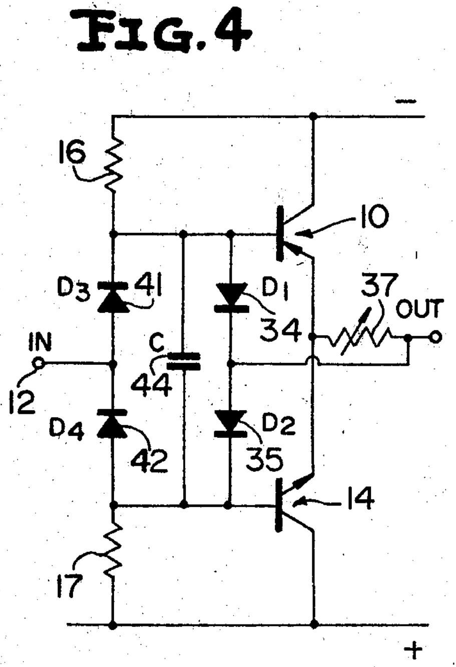
FIGURE 4 is a circuit diagram of the embodiment of FIGURE 3 in a transistor amplifier of the type shown in FIGURE 2.

FIGURE 4 shows an amplifier of the type illustrated in FIGURE 2 except that the protective network employed is that of the embodiment of FIGURE 3. Operation of the FIGURE 4 configuration is basically the same as that described immediately above.

It is to be noted in the embodiments of FIGURES 3 and 4 that both of diodes 41 and 42 need not be employed. Rather, conventional resistive biasing may be used in place of one or the other of these two diodes where desired for economic reasons.

FIGURE 5 illustrates this economic simplification and, as well, the previously mentioned simplification which may be utilized in the event of output voltage shift in a consistent direction under conditions of overload. Like reference numerals are used to refer to components of the circuit of FIGURE 5 corresponding to components used in the previously described embodiments. It will be noted that FIGURE 5 differs from FIGURE 3 only in the replacement of biasing diode 41 by biasing resistor 18, and in the elimination of switching diode 35. While both changes are a direct result of economic considerations, the latter change requires consistent output voltage shift under overload conditions. This will occur, for example, when load 50 is coupled to the negative supply terminal, in which case only diode 34 need be employed. If the load were coupled to the amplifier output and taken to the positive supply terminal, diode 35 would be retained and diode 34 eliminated. Operation of the embodiment of FIGURE 5 otherwise corresponds to that previously described with reference to FIGURE 3.

It is also evident that either resistor 16 or resistor 17 can be replaced by a driver transistor in which case the remaining bias elements (18 and 19 or 41 and 42) are the load impedance for said driver transistor.

The inventive principle is applicable wherever a non-desirable operating condition manifests itself as a difference in potential which can be used to switch a connection from input to output.

While I have disclosed certain embodiments of my invention, it will be apparent that variations in the specific details of construction which have been illustrated and described may be resorted to without departing from the spirit and scope of the invention.

I claim:

1. An amplifier protective circuit, including:
series connected class B push-pull transistors connected in a unity gain configuration and having a load junction therebetween,
a load connected to said junction in normally unity gain configuration,
a common signal input terminal for said transistors,
means connected for applying driving signal to said transistors from said common signal input terminal, said driving signal being alternately of positive and negative polarities,
electronic switch means connecting said common signal input terminal to said load, and
means rendering said electronic switch means non-conductive in response to substantially equal voltages at said load and said common signal input terminal and conductive of said driving signal from said common signal input terminal to said load in response to a predetermined discrepancy of voltage across said load with respect to the voltage at said common signal input terminal such that said voltage at said common signal input terminal is greater than the voltage across said load.

2. The combination according to claim 1, wherein said push-pull transistor amplifiers include a complementary symmetry transistor output stage, each transistor of said output stage including an emitter, and wherein said load is commonly connected to said emitters.

3. The combination according to claim 1, wherein said push-pull transistor amplifier includes an output stage having series transistors of the same conductivity type.

4. The combination according to claim 2, wherein said switch means includes separate switching devices operatively associated with each of said push-pull transistors and operative to conduct input signals of opposite polarities, respectively, to said load.

5. The combination according to claim 3, wherein said switch means is a single diode operatively associated with only one of said amplifiers.

6. The combination according to claim 2 wherein said switch means includes separate diode junctions connected in oppositely conducting paths between said signal input terminal and said load, and poled to be conductive of signals of opposite polarities, said load being connected to the junction of said diode junctions.

7. The combination according to claim 1, wherein is included resistive circuitry for accentuating said difference of voltage, said resistive circuitry being connected to said load to carry load current by introducing an AC off-bias for said electronic switch means.

8. The combination according to claim 1, wherein is included capacitive and signal rectifying storage means for rectifying and storing said signal only in response to said discrepancy of voltage and means responsive to voltage across said capacitive storage circuitry tending to maintain said electronic switch means conductive following termination of said discrepancy.

9. An amplifier protective circuit, comprising
a push-pull class B power amplifier having unity gain while said amplifier is operating normally and greater than unity gain when operating abnormally by virtue of a short circuited load or overdrive into saturation,
said amplifier including a class B output stage including two transistors connected in series, and having each a base electrode and a pair of further electrodes, one of said further electrodes being an emitter and the other of said further electrodes being a collector,
means connecting said load to the junction of the pairs of further electrodes,
a single signal input terminal,
drive circuits responsive to said signal input and connected to said single signal input terminal for driving said class B output stage in push-pull relation,
said drive circuits including two leads carrying signals, one for driving one of said bases and the other for driving the other of said bases,
switch means connected between at least one of said leads and said load,
said switch means including means responsive to the difference of the voltage on said one of said leads and the voltage across said load for maintaining said switch means non-conductive while said difference is substantially zero and for rendering said switch means conductive of said signal and said load while said voltage is sufficiently unequal to zero.

10. The combination according to claim 9, wherein said switch means comprises two unidirectionally conductive devices connected in series across said two leads and conductive in the same direction, said load being connected to the junction of said two devices.

11. The combination according to claim 9, wherein is further provided capacitive means for extending the time of conductivity of said switch means beyond the time during which said voltage is sufficiently unequal to zero.

References Cited

UNITED STATES PATENTS

| | | | |
|---|---|---|---|
| 2,672,530 | 3/1954 | Ensink | 330—102 |
| 2,816,180 | 12/1957 | French | 330—51 X |
| 2,878,380 | 3/1959 | Holmes | 330—13 X |
| 3,102,241 | 8/1963 | Johnstone | 330—22 |
| 3,277,386 | 10/1966 | Miyazawa | 307—202 X |

NATHAN KAUFMAN, *Primary Examiner.*

U.S. Cl. X.R.

330—13, 18, 24